(12) United States Patent
Tabei et al.

(10) Patent No.: US 9,070,628 B2
(45) Date of Patent: Jun. 30, 2015

(54) METHOD OF MANUFACTURING ESTERIFIED SUBSTANCE

(75) Inventors: Jun-ichi Tabei, Tokyo (JP); Yoshihisa Sone, Kashima (JP); Kiyotaka Murata, Kashima (JP); Kou Takahashi, Kashima (JP)

(73) Assignees: SUMITOMO BAKELITE CO., LTD., Tokyo (JP); AIR WATER INC., Sapporo-shi (JP)

( * ) Notice: Subject to any disclaimer, the term of this patent is extended or adjusted under 35 U.S.C. 154(b) by 183 days.

(21) Appl. No.: 13/698,363

(22) PCT Filed: May 25, 2011

(86) PCT No.: PCT/JP2011/002905
§ 371 (c)(1),
(2), (4) Date: Nov. 16, 2012

(87) PCT Pub. No.: WO2011/148627
PCT Pub. Date: Dec. 1, 2011

(65) Prior Publication Data
US 2013/0059983 A1 Mar. 7, 2013

(30) Foreign Application Priority Data

May 28, 2010 (JP) .................................. 2010-122191

(51) Int. Cl.
*C08F 210/14* (2006.01)
*H01L 23/29* (2006.01)
*C08F 222/06* (2006.01)
*C08F 222/16* (2006.01)
(Continued)

(52) U.S. Cl.
CPC ............ *H01L 23/293* (2013.01); *C08F 222/06* (2013.01); *C08F 210/14* (2013.01); *C08F 222/16* (2013.01); *C08F 2800/20* (2013.01); *C08L 61/06* (2013.01); *H01L 2224/32145* (2013.01); *H01L 2224/32245* (2013.01); *H01L 2224/48091* (2013.01); *H01L 2224/48247* (2013.01); *H01L 2224/73265* (2013.01); *H01L 2224/45144* (2013.01); *H01L 24/45* (2013.01); *H01L 2924/1301* (2013.01)

(58) Field of Classification Search
None
See application file for complete search history.

(56) References Cited

U.S. PATENT DOCUMENTS 3,051,562 A * 8/1962 Gee et al. ................... 44/386
3,854,893 A * 12/1974 Rossi ........................... 44/395
(Continued)

FOREIGN PATENT DOCUMENTS

JP 52-145496 12/1977
JP 4-255770 A 9/1992
(Continued)

OTHER PUBLICATIONS

International Search Report for PCT/JP2011/002905 dated Jul. 5, 2011.
(Continued)

*Primary Examiner* — Robert C Boyle
(74) *Attorney, Agent, or Firm* — Birch, Stewart, Kolasch & Birch, LLP

(57) ABSTRACT

According to the invention, a method of manufacturing an esterified substance including a process in which a copolymer is obtained by copolymerizing a 1-alkene having 5 to 80 carbon atoms and maleic anhydride, and a process in which an esterification reaction of the copolymer and an alcohol having 5 to 25 carbon atoms is caused in a presence of trifluoromethanesulfonic acid in order to obtain a reaction mixture containing an esterified substance including at least one repetition unit selected from formulae (c) to (f) is provided, and, in the formulae (c) to (f), R represents an aliphatic hydrocarbon group having 3 to 78 carbon atoms, $R^2$ represents a hydrocarbon group having 5 to 25 carbon atoms, m represents the copolymerization molar ratio X/Y of the 1-alkene (X) to the maleic anhydride (Y) and is 1/2 to 10/1, and n is an integer of more than or equal to 1.

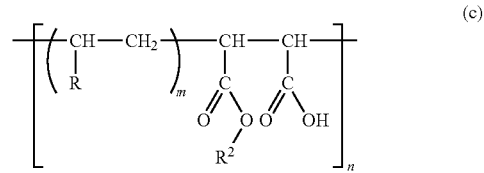

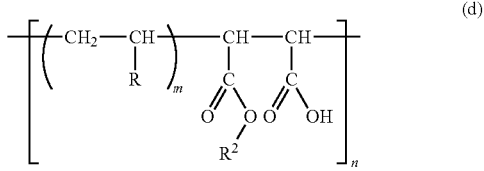

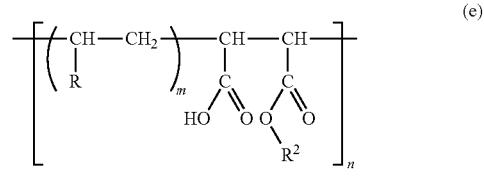

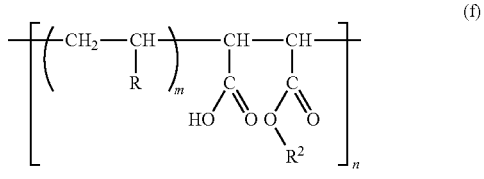

5 Claims, No Drawings

(51) Int. Cl.
   *C08L 61/06* (2006.01)
   *H01L 23/00* (2006.01)

(56) References Cited

U.S. PATENT DOCUMENTS

| | | | | |
|---|---|---|---|---|
| 4,151,069 | A | * | 4/1979 | Rossi ............................ 208/33 |
| 5,612,444 | A | | 3/1997 | Cai et al. |
| 6,140,458 | A | | 10/2000 | Terado et al. |
| 2008/0249204 | A1 | * | 10/2008 | Haring et al. ................ 522/182 |
| 2011/0054082 | A1 | * | 3/2011 | Mezger et al. ................... 524/5 |

FOREIGN PATENT DOCUMENTS

| JP | 5-345815 A | 12/1993 |
|---|---|---|
| JP | 9-20821 A | 1/1997 |
| JP | 2001-247748 A | 9/2001 |
| JP | 2002-53649 A | 2/2002 |
| JP | 2003-64239 A | 3/2003 |
| JP | 2005-298647 A | 10/2005 |
| JP | 2005-325159 A | 11/2005 |
| JP | 2006-182913 A | 7/2006 |
| JP | 2007-119563 A | 5/2007 |
| JP | 2008-156665 A | 7/2008 |

OTHER PUBLICATIONS

Office Action issued Dec. 16, 2014, in Japanese Patent Application No. 2012-517139.

* cited by examiner

METHOD OF MANUFACTURING ESTERIFIED SUBSTANCE

TECHNICAL FIELD

The present invention relates to a method of manufacturing an esterified substance. In more particular, the invention relates to a method of manufacturing an esterified substance which is to be used as an encapsulant of a semiconductor device.

BACKGROUND ART

For an encapsulant of a semiconductor device, an esterified substance is a useful additive for improving continuous moldability and reflow resistance. Such an esterified substance can be synthesized from a polymer of an acid anhydride and 1-alkene, and an alcohol (Patent Document 1).

Since a reaction, in which a polymer of an acid anhydride and a 1-alkene and an alcohol are reacted in order to obtain an esterified substance, is slow, a catalyst is required. In Patent Document 1, p-toluenesulfonate is used as a catalyst in order to cause the reaction. However, there are cases in which sulfonic acid remains in an obtained reaction product. In a case in which an esterified substance in which such p-toluenesulfonate remains is used as an encapsulant of a semiconductor device, there are cases in which this can lead to poor insulation of the semiconductor device. Therefore, in order to use the esterified substance obtained using the method of Patent Document 1 as an encapsulant of a semiconductor device, it is necessary to reduce residual sulfonic acids to a level at which defects such as poor insulation of the semiconductor device do not occur. Sulfonic acids can be removed by washing the reaction product, but removal through washing is troublesome in terms of operation, and the removal efficiency of sulfonic acids is not necessarily high. In addition, in a case in which a reaction product is excessively washed, there are cases in which a low-molecular-weight esterified substance or a 1-alkene which contributes to the reflow resistance and mold release properties that are necessary for encapsulating of a semiconductor device are removed.

RELATED DOCUMENT

Patent Document

[Patent Document 1] Japanese Patent Application No. 2010-122191

DISCLOSURE OF THE INVENTION

The invention has been made in consideration of the above circumstances, and is to provide a method of manufacturing an esterified substance which is excellent in terms of purification efficiency and is useful as an encapsulant for a semiconductor device.

According to the invention, a method of manufacturing an esterified substance including a process in which a copolymer is obtained by copolymerizing a 1-alkene having 5 to 80 carbon atoms and maleic anhydride, and a process in which an esterification reaction of the copolymer and an alcohol having 5 to 25 carbon atoms is caused in the presence of trifluoromethanesulfonic acid in order to obtain a reaction mixture containing an esterified substance including at least one repetition unit selected from formulae (c) to (f) is provided.

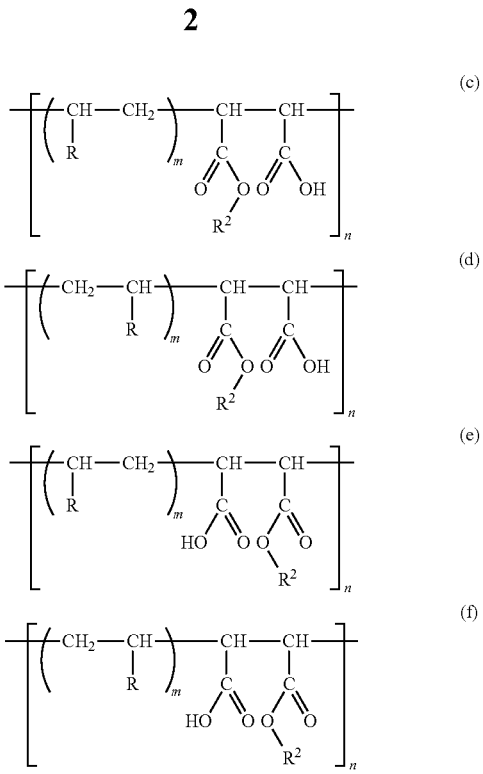

(In the formulae (c) to (f), R represents an aliphatic hydrocarbon group having 3 to 78 carbon atoms, $R^2$ represents a hydrocarbon group having 5 to 25 carbon atoms, m represents the copolymerization molar ratio X/Y of the 1-alkene (X) to the maleic anhydride (Y) and is 1/2 to 10/1, and n is an integer of more than or equal to 1.)

According to an embodiment of the invention, the method further includes, after the process in which a reaction mixture containing an esterified substance is obtained, a process in which free trifluoromethanesulfonic acid is removed through a depressurization treatment.

According to the embodiment of the invention, in the method, the reaction mixture contains the 1-alkene having 5 to 80 carbon atoms.

According to the embodiment of the invention, in the method, the proportion of the 1-alkene having 5 to 80 carbon atoms in the reaction mixture, measured through GPC, is more than or equal to 8% by area and less than or equal to 20% by area.

According to the embodiment of the invention, in the method, the 1-alkene is a 1-alkene having 28 to 60 carbon atoms.

According to the embodiment of the invention, in the method, the alcohol is stearyl alcohol.

According to the embodiment of the invention, in the method, the amount of the trifluoromethanesulfonic acid is more than or equal to 100 ppm and less than or equal to 1000 ppm with respect to the total mass of the copolymer and the alcohol having 5 to 25 carbon atoms.

According to the invention, it is possible to obtain a reaction mixture in which the content of a sulfonic acid component is reduced using trifluoromethanesulfonic acid as a catalyst in a reaction between a polymer of an acid anhydride and a 1-alkene, and an alcohol, and to realize an efficient method of manufacturing an esterified substance. That is, since it is not necessary to remove the sulfonic acid component, it is possible to efficiently obtain an esterified substance without degrading the operation efficiency caused by removal of the sulfonic acid component. In addition, trifluoromethanesulfonic acid may be removed through reduced-pressure distillation as necessary. Therefore, it is possible to obtain a reaction mixture in which the content of the sulfonic acid component is sufficiently reduced. In addition, in a case in which the esterified substance obtained in the above manner is used as an encapsulant for a semiconductor device, it is possible to reduce the occurrence of defects such as poor insulation of the semiconductor device, caused by the sulfonic acid component.

DESCRIPTION OF EMBODIMENTS

Hereinafter, a method of manufacturing an esterified substance of the invention will be described.

The method of manufacturing an esterified substance of the invention includes the following processes:

(a) a process in which a copolymer is obtained by copolymerizing a 1-alkene having 5 to 80 carbon atoms and maleic anhydride; and (b) a process in which an esterification reaction of the copolymer obtained in the process (a) and an alcohol having 5 to 25 carbon atoms is caused in the presence of trifluoromethanesulfonic acid in order to obtain a reaction mixture containing an esterified substance including at least one repetition unit selected from formulae (c) to (f).

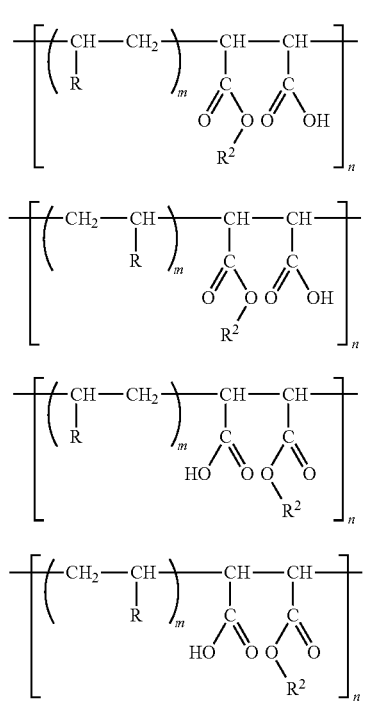

(In the formulae (c) to (f), R represents an aliphatic hydrocarbon group having 3 to 78 carbon atoms, $R^2$ represents a hydrocarbon group having 5 to 25 carbon atoms, m represents the copolymerization molar ratio X/Y of the 1-alkene (X) to the maleic anhydride (Y) and is 1/2 to 10/1, and n is an integer of more than or equal to 1.)

Examples of a 1-alkene having 5 to 80 carbon atoms that is used in the process (a) include linear 1-alkenes, such as 1-pentene, 1-hexene, 1-octene, 1-decene, 1-dodecene, 1-octadecene, 1-eicosene, 1-docosene, 1-tetracontene, 1-hexacontene, 1-octacosene, 1-triacontene, 1-hentriacontene, 1-dotriacontene, 1-tritriacontene, 1-tetratriacontene, 1-pentatriacontene, 1-hexatriacontene, 1-tetracontene, 1-hentetracontene, 1-dotetracontene, 1-tritetracontene, 1-tetratetracontene, 1-pentacontene, 1-henpentacontene, 1-dopentacontene, 1-tripentacontene, 1-pentapentacontene, 1-hexacontene, 1-heptacontene, and 1-octacontene; branched-chain 1-alkenes, such as 3-methyl-1-triacontene, 3,4-dimethyl-triacontene, 3-methyl-1-tetracontene, and 3,4-dimethyl-tetracontene; and the like, and the above may be used singly or in a combination of more than or equal to two kinds.

In a case in which the obtained esterified substance is used as an encapsulant of a semiconductor device, the number of carbon atoms included in a 1-alkene is more preferably 10 to 70 from the viewpoint of adhesion properties to a lead frame included in a semiconductor device, and still more preferably 28 to 60 from the viewpoint of mold release properties.

Examples of the copolymer of a 1-alkene having 5 to 80 carbon atoms and maleic anhydride which is obtained in the process (a) include compounds having a structure represented by the formulae (9) and (10), and examples of commercially available products thereof include DIACARNA (registered trade mark) 30 (a commercially available product manufactured by Mitsubishi Chemical Corporation) for which 1-octacosene, 1-triacontene, 1-tetracontene, 1-pentacontene, 1-hexacontene, or the like is used as a raw material.

[Chemical formula 9]

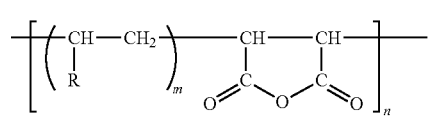

[Chemical formula 10]

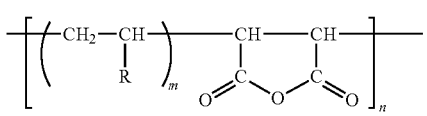

R in the formulae (9) and (10) represents an aliphatic hydrocarbon group having 3 to 78 carbon atoms, and n is an integer of more than or equal to 1. m represents the copolymerization ratio of a 1-alkene to maleic anhydride, and is not particularly limited. In a case in which a 1-alkene is X moles and maleic anhydride is Y moles, X/Y, that is, m is 1/2 to 10/1, preferably 1/2 to 5/1, more preferably 1/2 to 2/1, and still more preferably approximately 1/1 at which both components are at almost the same moles.

The method of manufacturing the copolymer of a 1-alkene and maleic anhydride is not particularly limited, and an ordinary copolymerization method such as causing a reaction of raw materials may be used. In the reaction, an organic solvent or the like in which a 1-alkene and maleic anhydride can be dissolved may be used, and while the organic solvent is not particularly limited, toluene is preferable, and an aromatic-based solvent, an ether-based solvent, a halogen-based solvent, or the like can be used. The reaction temperature also varies according to the kind of the organic solvent being used, is preferably set to 50° C. to 200° C. from the viewpoint of reactivity and productivity, and more preferably set to 100° C. to 150° C. The reaction time is not particularly limited as long as the copolymer can be obtained, but is preferably 1 hour to 30 hours from the viewpoint of productivity, more preferably 2 hours to 15 hours, and still more preferably 4 hours to 10 hours. After the end of the reaction, if necessary, unreacted components, the solvent, and the like can be removed under heating depressurization or the like. The preferable conditions are a temperature of 100° C. to 220° C. and more preferably 120° C. to 180° C., a pressure of less than or equal to 13.3×10³ Pa and more preferably less than or equal to 8×10³ Pa, and a time of 0.5 hours to 10 hours. In addition, if necessary, a radical polymerization-based initiator such as azobisisobutyronitrile (AIBN) or benzoyl peroxide (BPO) may be added for the reaction.

The copolymer obtained in the process (a) is esterified using an alcohol having 5 to 25 carbon atoms in the presence of trifluoromethanesulfonic acid in the process (b).

Examples of the alcohol having 5 to 25 carbon atoms which is used in the process (b) include linear or branched-chain aliphatic saturated alcohols, such as pentyl alcohol, hexyl alcohol, octyl alcohol, decyl alcohol, lauryl alcohol, myristyl alcohol, cetyl alcohol, stearyl alcohol, eicosyl alcohol, behenyl alcohol, 2-methyl-decane-1-ol, 2-ethyl-decane-1-ol, and 2-hexyl-octane-1-ol; linear or branched-chain aliphatic unsaturated alcohols, such as hexenol, 2-hexene-1-ol, 1-hexene-3-ol, pentenol, 2-methyl-1-pentenol; and the like, and the above may be used singly or in a combination of more than or equal to two kinds. Among the above, a linear alcohol having 10 to 25 carbon atoms is preferable from the viewpoint of mold release properties in a case in which the obtained esterified substance is used as an encapsulant of a semiconductor device, and a linear aliphatic saturated alcohol having 15 to 20 carbon atoms is more preferable from the viewpoint of continuous moldability. When the number of carbon atoms in the alcohol is less than the lower limit value, continuous moldability (mold release properties) is poor, and, when the number of carbon atoms exceeds the upper limit value, there is a tendency for the adhesion properties of a semiconductor device with respect to a copper lead frame to degrade.

The amount of trifluoromethanesulfonic acid is preferably set to more than or equal to 100 ppm and less than or equal to 1000 ppm with respect to the total amount of the copolymer and the alcohol in order to exhibit the performances. When the amount is below the lower limit value, trifluoromethanesulfonic acid does not function sufficiently as an esterification catalyst, and, when the amount exceeds the upper limit value, there are cases in which the obtained esterified substance is oxidized. In a case in which an oxide of the esterified substance is used as an encapsulant of a semiconductor device, there is a tendency for continuous moldability to degrade.

The molar ratio of the copolymer obtained in the process (a) to the alcohol having 5 to 25 carbon atoms is not particularly limited, and can be arbitrarily set; however, since the degree of the hydrophilic properties of the esterified substance can be controlled by adjusting the reaction molar ratio, the molar ratio is preferably appropriately set in accordance with a semiconductor encapsulant being applied. In the reaction, an organic solvent in which a 1-alkene and maleic anhydride can be dissolved or the like may be used. The organic solvent is not particularly limited, toluene is preferable, and an aromatic-based solvent, an ether-based solvent, a halogen-based solvent, or the like can be used. The reaction temperature also varies by the kind of the organic solvent being used, is preferably set to 50° C. to 200° C. from the viewpoint of reactivity and productivity, and more preferably set to 120° C. to 170° C. The reaction time is not particularly limited as long as the copolymer can be obtained, but is preferably 1 hour to 30 hours from the viewpoint of productivity, more preferably 2 hours to 30 hours, and still more preferably 4 hours to 28 hours. After the end of the reaction, if necessary, unreacted components, the solvent, and the like can be removed under heating depressurization or the like. The preferable conditions are 100° C. to 220° C. and more preferably 120° C. to 180° C. in temperature, less than or equal to 13.3×10³ Pa and more preferably less than or equal to 8×10³ Pa in pressure, and 0.5 hours to 10 hours in time.

The esterified substance obtained by esterifying the copolymer of a 1-alkene and maleic anhydride using the alcohol having 5 to 25 carbon atoms includes at least one repetition unit selected from the formulae (c) to (f).

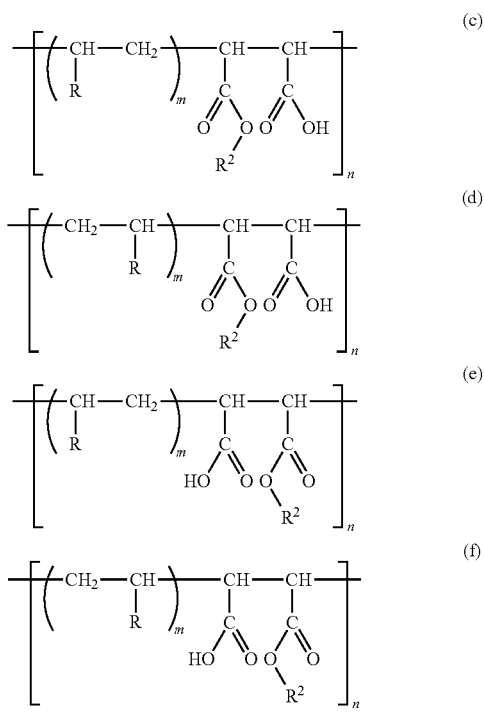

In the formulae (c) to (f), R represents an aliphatic hydrocarbon group having 3 to 78 carbon atoms, $R^2$ represents a hydrocarbon group having 5 to 25 carbon atoms, m represents the copolymerization molar ratio X/Y of the 1-alkene (X) to the maleic anhydride (Y) and is 1/2 to 10/1, and n is an integer of more than or equal to 1.

Examples of the esterified substance of the invention include (1) an esterified substance singly including at least one of the formulae (c) to (f) in the main-chain skeleton; (2) an esterified substance including at least two of the formulae (c) to (f) in the main-chain skeleton randomly, regularly, or in a block shape; and the like, and the above may be used singly or in mixture of more than or equal to two kinds.

The reaction yield of the esterification reaction between the copolymer and the alcohol is preferably more than or equal to 70 mol %, more preferably more than or equal to 80 mol %, and still more preferably more than or equal to 90%.

The reaction mixture including the esterified substance obtained in the process (b) may include a 1-alkene which is present unreacted in the process (a). The proportion of a 1-alkene in the reaction mixture is preferably more than or equal to 8% by mass and less than or equal to 20% by mass in a case in which the proportion is measured through GPC. When the proportion is more than or equal to the lower limit value, an effect of improving mold release properties can be obtained. When the proportion is less than or equal to the upper limit value, there is little concern that adhesion properties may degrade or the like.

The number average molecular weight of the esterified substance obtained using the method of the present invention is preferably 2000 to 10000. Within the above range, in a case in which the esterified substance is used as an encapsulant of a semiconductor, both adhesion properties with respect to a copper lead frame of a semiconductor device and mold release properties can be achieved at the same time.

The blending amount of a compound obtained by esterifying the copolymer of a 1-alkene and maleic anhydride using an alcohol in the presence of trifluoromethanesulfonic acid is not particularly limited, but is preferably more than or equal to 0.5 parts by mass and less than or equal to 10 parts by mass, and more preferably more than or equal to 1 part by mass and less than or equal to 5 parts by mass with respect to 100 parts by mass of an epoxy resin. When the blending amount is less than the lower limit value, there is a tendency for mold release properties to degrade, and, when the blending amount exceeds the upper limit value, there is a tendency for adhesion properties with respect to an oxidized copper lead frame to become insufficient.

In the invention, after the process (b), if necessary, free trifluoromethanesulfonic acid in the reaction mixture obtained in the process (b) may be removed through a depressurization treatment. Since the content of trifluoromethanesulfonic acid can be reduced using the above method, in a case in which a reaction product including the esterified substance obtained in the process (b) is used as a semiconductor encapsulant, adhesion properties with respect to a copper lead frame of a semiconductor device and mold release properties are favorable.

EXAMPLES

Hereinafter, the invention will be described in detail using examples, but the invention is not limited thereto.

Synthesis Example 1

A copolymer of a 1-alkene having 28 to 60 carbon atoms and maleic anhydride (DIACARNA R30, manufactured by Mitsubishi Chemical Corporation, 100.0 g) and stearyl alcohol (47.0 g) were fed into a 300 ml 4-neck separable flask, dissolved at 70° C., and then an aqueous solution of 10 wt % trifluoromethanesulfonic acid (0.5 g) was added. An obtained reaction mixture was stirred at 150° C. over 5 hours.

After that, the liquid temperature was cooled to 120° C., and free trifluoromethanesulfonic acid and water were removed through 2-hour depressurization distillation under depressurization of 30 Torr, thereby obtaining an esterified substance A (144 g). GPC measurement results showed that the content of a 1-alkene in the esterified substance A was 15% by mass, and the content of sulfur in the esterified substance A was 74 ppm.

Synthesis Example 2

A copolymer of a 1-alkene having 28 to 60 carbon atoms and maleic anhydride (DIACARNA R30, manufactured by Mitsubishi Chemical Corporation, 100.0 g) and stearyl alcohol (47.0 g) were fed into a 300 ml 4-neck separable flask, dissolved at 70° C., and then p-toluenesulfonate monohydrate (1.5 g) was added. An obtained reaction mixture was stirred at 150° C. over 4 hours.

After that, the liquid temperature was cooled to 80° C., and acetone (131.7 g) was added dropwise under a reflux over 60 minutes. After the dropwise addition, stirring was stopped, and the reaction mixture was left to stand idle at a liquid temperature of 70° C. for 60 minutes so that the reaction base liquid was separated into two layers. The upper layer of an acetone layer including unreacted stearyl alcohol and the sulfonate component was removed. Depressurization distillation was carried out on the remaining lower layer under depressurization of 30 Torr at 90° C. over 6 hours in order to remove residual acetone, thereby obtaining an esterified substance B (144 g). GPC measurement results showed that the content of a 1-alkene in the esterified substance B was 10% by mass, and the content of sulfur in the esterified substance B was 800 ppm.

Synthesis Example 3

A copolymer of a 1-alkene having 28 to 60 carbon atoms and maleic anhydride (DIACARNA R30, manufactured by Mitsubishi Chemical Corporation, 100.0 g) and stearyl alcohol (47.0 g) were fed into a 300 ml 4-neck separable flask equipped with a condenser, dissolved at 70° C., and then p-toluenesulfonate monohydrate (1.5 g) was added. An obtained reaction mixture was stirred at 150° C. over 4 hours.

After that, the liquid temperature was cooled to 80° C., and acetone (131.7 g) was added dropwise under a reflux over 60 minutes. After the dropwise addition, stirring was stopped, and the reaction mixture was left to stand idle at a liquid temperature of 70° C. for 60 minutes so that the reaction base liquid was separated into two layers. The upper layer of an acetone layer including unreacted stearyl alcohol and the sulfonate component was removed. After the washing operation was repeated 3 times, depressurization distillation was carried out on the remaining lower layer under depressurization of 30 Torr at 90° C. over 6 hours in order to remove residual acetone, thereby obtaining an esterified substance C (135 g). GPC measurement results showed that the content of a 1-alkene in the esterified substance C was 7% by mass, and the content of sulfur in the esterified substance C was 400 ppm.

Example 1

The esterified substance A obtained in the synthesis example 1 and components shown in the following table were blended at the parts by mass shown in the table, biaxially kneaded under conditions of a kneading temperature of 100° C. and a kneading time of 30 minutes in order to be cooled and crushed, thereby manufacturing a resin composition. The obtained resin composition was evaluated in terms of performances as a semiconductor encapsulant (continuous moldability). The results are shown in Table 1.

Comparative Examples 1 and 2

The esterified substances B and C obtained in the synthesis examples 2 and 3 and components shown in the following table were blended at the parts by mass shown in the table, biaxially kneaded under conditions of a kneading temperature of 100° C. and a kneading time of 30 minutes in order to be cooled and crushed, thereby manufacturing a resin composition. The obtained resin composition was evaluated in terms of performances as a semiconductor encapsulant (continuous moldability). The results are shown in Table 1.

The respective components used in the example and the comparative examples are shown below.

Epoxy resin 1: biphenyl-type epoxy resin having an epoxy equivalent amount of 185 g/eq and a melting point of 108° C. (manufactured by Japan Epoxy Resin Co., Ltd., product name: EPICOAT YX-4000K)

Epoxy resin 2: phenol aralkyl-type epoxy resin having a phenylene skeleton with an epoxy equivalent amount of 237 g/eq and a softening point of 52° C. (manufactured by Nippon Kayaku Co., Ltd., product name: NC2000)

Phenol resin-based curing agent 1: phenol aralkyl-type phenol resin having a biphenylene skeleton with a hydroxyl group equivalent amount of 199 g/eq and a softening point of 64° C. (manufactured by Meiwa Plastic Industries, Ltd., product name: MEH-7851SS)

Inorganic filling material 1: spherical molten silica having an average particle diameter of 10.8 μm and a specific surface area of 5.1 m$^2$/g Curing accelerator 1: adduct of triphenylphosphine and p-benzoquinone Coupling agent 1: γ-glycidoxy propyl trimethoxysilane (manufactured by Chisso Corporation, product name: S510=GPS-M)

Colorant 1: carbon black (manufactured by Mitsubishi Chemical Corporation, product name: CARBON #5)

Continuous moldability (air vent block and mold stain) was measured as follows:

Up to 400 shots of molding in which an 80-pin quad flat package (80pQFP; copper lead frame, package outer size: 14 mm×20 mm×2 mm-thick, pad size: 6.5 mm×6.5 mm, chip size: 6.0 mm×6.0 mm×0.35 mm-thick) was obtained from an epoxy resin composition by encapsulating chips and the like were carried out under conditions of a mold temperature of 175° C., an injection pressure of 9.8 MPa, and a curing time of 70 seconds using a low-pressure transfer automatic molding machine (manufactured by Dai-ichi Seiko Co., Ltd., GP-ELF).

For evaluating the air vent block, the mold at the 50$^{th}$ shot was visually observed in order to confirm the presence of air vent block (a state in which the air vent is blocked due to the cured resin fixed to the air vent (a width of 0.5 mm and a thickness of 50 μm) portion), and evaluation was made using the following 4 ranks. The ranks become more favorable in the order of A, B, C, and . . . , and ranks of better than or equal to rank C are in a practically available range. Evaluation results are shown below.

A: No problem occurs until the 400$^{th}$ shot.

B: Air vent block occurs up to the 300$^{th}$ shot.

C: Air vent block occurs up to the 200$^{th}$ shot.

D: Air vent block occurs up to the 100$^{th}$ shot.

Regarding mold stain, the mold was observed after the 400$^{th}$ shot, and evaluation was made using the following 5 ranks based on the degree of stain spreading from the gate opening. The ranks become more favorable in the order of A, B, C, and . . . , and ranks of better than or equal to rank C are in a practically available range.

A: No stain occurs.

B: Stain spreads at less than or equal to 20% by area of the cavity surface.

C: Stain spreads at more than 20% by area and less than or equal to 40% by area of the cavity surface.

D: Stain spreads at more than 40% by area and less than or equal to 60% by area of the cavity surface.

E: Stain spreads at more than 60% by area of the cavity surface.

TABLE 1

|  |  | Example 1 | Comparative example 1 | Comparative example 2 |
|---|---|---|---|---|
| Composition of epoxy resin composition [% by mass] | Epoxy resin 1 | 3.01 | 3.01 | 3.01 |
| | Epoxy resin 2 | 3.01 | 3.01 | 3.01 |
| | Phenol resin-based curing agent 1 | 5.18 | 5.18 | 5.18 |
| | Inorganic filling material 1 | 88 | 88 | 88 |
| | Esterified substance A | 0.20 | | |
| | Esterified substance B | | 0.20 | |
| | Esterified substance C | | | 0.20 |
| | Curing accelerator 1 | 0.27 | 0.27 | 0.27 |
| | Coupling agent 1 | 0.03 | 0.03 | 0.03 |
| | Colorant 1 | 0.30 | 0.30 | 0.30 |
| Continuous moldability | Air vent block | A | A | B |
| | Mold Stain | A | B | A |

The invention claimed is:

1. A method of manufacturing an esterified substance comprising:

a process in which a copolymer is obtained by copolymerizing a 1-alkene having 28 to 60 carbon atoms and maleic anhydride;

a process in which an esterification reaction of the copolymer and an alcohol having 5 to 25 carbon atoms is caused in a presence of trifluoromethanesulfonic acid in order to obtain a reaction mixture containing an esterified substance including at least one repetition unit selected from formulae (c) to (f); and after the process in which a reaction mixture containing an esterified substance is obtained, a process in which free trifluoromethanesulfonic acid is removed through a depressurization treatment, wherein in the formulae (c) to (f), R represents an aliphatic hydrocarbon group having 3 to 78 carbon atoms, R$^2$ represents a hydrocarbon group having 5 to 25 carbon atoms, m represents the copolymerization molar ratio X/Y of the 1-alkene (X) to the maleic anhydride (Y) and is 1/2 to 10/1, and n is an integer of more than or equal to 1:

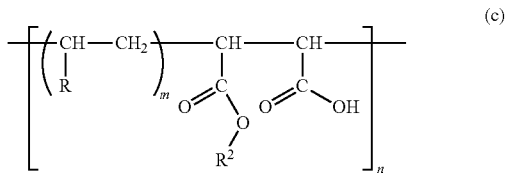

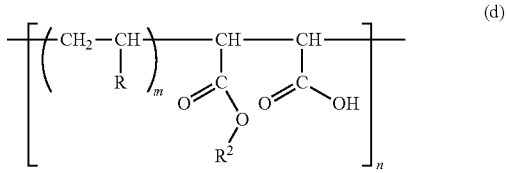

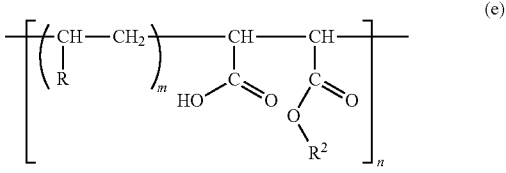

-continued

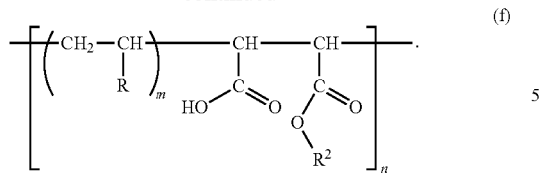

2. The method according to claim 1,
wherein the reaction mixture contains the 1-alkene having 28 to 60 carbon atoms.

3. The method according to claim 2,
wherein a proportion of the 1-alkene having 28 to 60 carbon atoms in the reaction mixture, measured through GPC, is more than or equal to 8% by mass and less than or equal to 20% by mass.

4. The method according to claim 1,
wherein the alcohol is stearyl alcohol.

5. The method according to claim 1,
wherein an amount of the trifluoromethanesulfonic acid is more than or equal to 100 ppm and less than or equal to 1000 ppm with respect to a total mass of the copolymer and the alcohol having 5 to 25 carbon atoms.

* * * * *